United States Patent
Uchida et al.

[11] Patent Number: 6,111,453
[45] Date of Patent: Aug. 29, 2000

[54] POWER SWITCHING DEVICE

[75] Inventors: Saori Uchida; Akio Uenishi, both of Fukuoka, Japan

[73] Assignee: Mitsubishi Denki Kabushiki Kaisha, Tokyo, Japan

[21] Appl. No.: 08/291,207

[22] Filed: Aug. 16, 1994

[30] Foreign Application Priority Data

Aug. 26, 1993 [JP] Japan ................................ 5-211302

[51] Int. Cl.[7] .......................... H03K 17/60; H01H 47/00
[52] U.S. Cl. ...................... 327/384; 327/379; 327/388; 327/389
[58] Field of Search ..................... 327/376, 377, 327/379, 380, 381, 382, 384, 389, 310, 311, 419, 108, 388; 361/159

[56] References Cited

U.S. PATENT DOCUMENTS

| | | | |
|---|---|---|---|
| 4,639,823 | 1/1987 | Kuroki | 327/380 |
| 5,166,541 | 11/1992 | Mori | 327/379 |
| 5,332,938 | 7/1994 | McEwan | 327/384 |

FOREIGN PATENT DOCUMENTS

| | | |
|---|---|---|
| 33 00 682 C2 | 1/1986 | Germany . |
| 60-134521 | 7/1985 | Japan . |
| 3-129507 | 6/1991 | Japan . |

OTHER PUBLICATIONS

Elekronik, vol. 24, 1990, pp. 62–67, Werner Boesterling, et al., "Optimierte Leistungssteuerung".

*Primary Examiner*—Dinh T. Le
*Attorney, Agent, or Firm*—Oblon, Spivak, McClelland, Maier & Neustadt, P.C.

[57] ABSTRACT

A power switching device which decreases both surge voltage and switching loss. As the inductor is connected to the emitter electrode of the IGBT element, the potential of the emitter electrode changes in the direction in which the IGBT element maintains the ON state with the attenuation of the main current when the IGBT element turns OFF from ON. Furthermore, as the inductor is included in the path of the OFF driving current for bringing the IGBT element to OFF, the OFF driving current once raises and then decreases. As a result, because the transition from ON to OFF calmly proceeds, the occurrence of the surge voltage is suppressed. On the other hand, since the inductor is not included in the path of the ON driving current, the transition from OFF to ON of the IGBT element is rapidly made. Accordingly, the switching loss occurring in the transition period is decreased. The decrease in the surge voltage and the decrease in the switching loss are compatibly realized.

8 Claims, 6 Drawing Sheets

SURGE VOLTAGE−SWITCHING LOSS CHARACTERISTIC

INDUCTANCE–SWITCHING LOSS CHARACTERISTIC

RESISTANCE–SWITCHING LOSS CHARACTERISTIC

RESISTANCE-SURGE VOLTAGE CHARACTERISTIC

POWER SWITCHING DEVICE

BACKGROUND OF THE INVENTION

1. Field of the Invention

The present invention relates to power switching devices, and particularly to an improvement for compatibly suppressing the occurrence of switching loss and the occurrence of surge voltage when connected to an inductive load.

2. Description of the Background Art

<Structure of Conventional Device>

FIG. 6 is a circuit diagram showing a conventional power switching device using an insulated gate bipolar transistor element (an IGBT element) and peripheral devices thereof. The IGBT element 6 included in the power switching device turns on and off between two main electrodes, that is, a collector electrode C and an emitter electrode E to turn on and off a load circuit connected to these main electrodes. An inductive load 8 and a DC power source 10 are connected to the load circuit. The inductive load 8 and the DC power source 10 are provided outside the power switching device.

A freewheeling diode 7 is connected to the inductive load 8 in parallel and a snubber capacitor 9 is connected to the DC power source 10 in parallel. The freewheeling diode 7 and the snubber capacitor 9 form a surge absorption circuit for absorbing the voltage surge due to the inductive load 8. Inductances 11 and 12 parasitically occur in the wiring connecting the DC power source 10, the freewheeling diode 7 and the snubber capacitor 9.

Emitter electrodes E of two transistors 3a and 3b are connected to the gate electrode G of the IGBT element 6 through a resistance 4. The collector electrodes C of these transistors which are mutually complementary are connected to a DC power source 5. The low potential side output of the DC power source 5 is connected to the emitter electrode E of the IGBT element 6. A base resistance 2 is connected to the base electrodes B of the transistors 3a and 3b. A pulse generator 1 is connected between one end of the base resistance 2 and the emitter electrode E of the IGBT element 6. The pulse generator 1 is provided outside the power switching device.

The transistors 3a, 3b, the resistances 2, 4 and the DC power source 5 form a control circuit for turning on and off the IGBT element in response to pulse signals inputted to the base electrodes B through the base resistance 2.

<Operation of Conventional Device>

The conventional device, which has such structure as described above, operates as described below. When the pulse generator 1 inputs a high voltage signal (15 V, for example) to the base resistance 2, the transistor 3a turns on and the transistor 3b turns off. The current (ON driving current) supplied from the DC power source 5 is then provided to the gate electrode G through the transistor 3a, and the voltage between the gate electrode G and the emitter electrode E, i.e., the gate voltage exceeds a gate threshold voltage peculiar to the IGBT element 6, and thus the IGBT element 6 turns on. The IGBT element 6 turns on to turn on the load circuit, and then the load current is supplied from the DC power source 10 to the inductive load 8.

When the pulse generator 1 inputs a low voltage signal (0 V, for example) to the base resistance 2, the transistor 3b turns on and the transistor 3a turns off. Then the current (OFF driving current) in the direction opposite to the ON driving current is supplied to the gate electrode G, and the voltage between the gate electrode G and the emitter electrode E, i.e., the gate voltage becomes lower than the gate threshold voltage, and thus the IGBT element 6 turns off. The IGBT element 6 turns off to turn off the load circuit, and then the supply of the load current from the DC power source 10 to the inductive load 8 stops.

As the inductive load 8 has a function of holding the current corresponding to the magnitude of the inductance, the load current does not immediately become 0 when the IGBT element 6 turns off from ON, but attenuates while flowing back in the surge absorption circuit formed of the freewheeling diode 7 and the like. The surge absorption circuit is provided to prevent application of excessive surge voltage between the collector electrode C and the emitter electrode E of the IGBT element 6 when the IGBT element 6 turns off from on by providing the inductive load 8 with a path for flow-back of the load current.

The conventional art, however, has such a problem as described below. That is to say, the parasitic inductance 11 is caused on the surge absorption circuit as described above. When the IGBT element 6 turns off from on, the current flowing through the parasitic inductances 11 and 12 rapidly increases as the load current flowing though the inductive load 8 starts flowing back to the surge absorption circuit. The rapid increase in the flow-back current causes spike-like high voltage in the parasitic inductances 11 and 12.

As a result, when the IGBT element 6 turns off from on, the surge voltage is applied between the collector electrode C and the emitter electrode E of the IGBT element 6. That is to say, the conventional power switching device has a problem that the original object of the surge absorption circuit is not achieved enough because of the existence of the parasitic inductances 11 and 12.

It is an effective way for reducing the surge voltage to make the transition of the IGBT element 6 from ON to OFF, i.e., to slow down the switching speed. If the switching speed is slowed down, however, another problem arises. That is, the power loss in the switching operation in the IGBT element 6, i.e., the switching loss, increases. The conventional power switching device has a problem that the two requirements, i.e., the decrease in the surge voltage and the decrease in the switching loss, contradict each other and it is difficult to simultaneously satisfy the both.

SUMMARY OF THE INVENTION

The present invention is directed to a power switching device in which a power switching element performs an OFF operation and an ON operation in response to an output of a control circuit connected to a control electrode of the power switching element to turn off and on a load circuit connected to a main electrode of the power switching element. According to the present invention, the device comprises an inductor interposed in the load circuit, and the control circuit is so structured that a path of OFF driving current which the control circuit supplies to the control electrode to bring the power switching element to an OFF state includes the inductor, a main current of the power switching element and the OFF driving current flow in the opposite direction from each other in the inductor, and a path of ON driving current which the control circuit supplies to the control electrode to bring the power switching element to an ON state does not include the inductor.

According to the present invention, the device has the inductor interposed in the load circuit and the inductor is included in the path of the OFF driving current. Further, a main current of the power switching element and the OFF driving circuit flow in the opposite direction from each other in the inductor. Accordingly, when the power switching element is turned off, the OFF driving current which has once raised decreases due to a voltage induced to the inductor by a decrease in the main current. As the result, the progress of transition from ON to OFF is soft. Therefore, the attenuation of the main current flowing to the main electrode of the power switching element is softened. As a result, occurrence of the surge voltage during OFF driving is suppressed.

On the other hand, the inductor is not included in the path of the ON driving current. Accordingly, when the power switching element is turned on, the ON driving current rapidly increases to realize switching at a high speed. As a result, the switching loss during ON driving is suppressed. That is to say, in this device, by slowing down the switching speed during the OFF driving when the occurrence of the surge voltage causes a serious problem and by increasing the switching speed during the ON driving when the occurrence of the surge voltage does not cause any problem, the control of the surge voltage and the decrease of the overall switching loss are compatibly realized.

Preferably, in the switching deice for electric power, the power switching, element is an insulated gate bipolar transistor element, one end of the inductor is connected to an emitter electrode of the insulated gate bipolar transistor element, and the control circuit includes a transistor for OFF driving for supplying the OFF driving current to the control electrode by turning on the path of the OFF driving current and a transistor for ON driving for supplying the ON driving current to the control electrode by turning on the path of the ON driving current.

According to the power switching device of the present invention, as the inductor is connected to the emitter electrode of the IGBT element, the potential of the emitter electrode changes direction so that the IGBT element maintains the ON state with the attenuation of the main current flowing in the IGBT element when the IGBT element turns off from on. With this kind of feed-back effect produced by the inductor, the switching speed is slowed down more effectively. Also, as the IGBT element is used as the power switching element, a power switching device with high switching speed and small loss can be realized. Furthermore, by using the transistor for OFF driving and the transistor for ON driving, the control circuit can be simply structured.

Preferably, in the power switching device, the insulated gate bipolar transistor element has current capacity equal to or larger than 100 A, the magnitude of the inductance of the inductor is 1 nH–5 nH, a resistance value of an OFF driving resistance interposed in the path of the OFF driving current is equal to or smaller than 3 Ω, and a resistance value of an ON driving resistance interposed in the path of the ON driving current is equal to or smaller than 3 Ω.

According to the power switching device of the present invention, the value of the inductance of the inductor and the resistance values of the ON driving resistance and the OFF driving resistance are optimized, therefore the control of the surge voltage and the decrease in the switching loss can be realized most suitably in a device with large current capacity.

Accordingly, it is an object of the present invention to provide a power switching device which can compatibly realize the decrease in the switching loss and the decrease in the surge voltage.

These and other objects, features, aspects and advantages of the present invention will become more apparent from the following detailed description of the present invention when taken in conjunction with the accompanying drawings.

DESCRIPTION OF THE PREFERRED EMBODIMENT

<1. Structure of Device>

Figure 1:
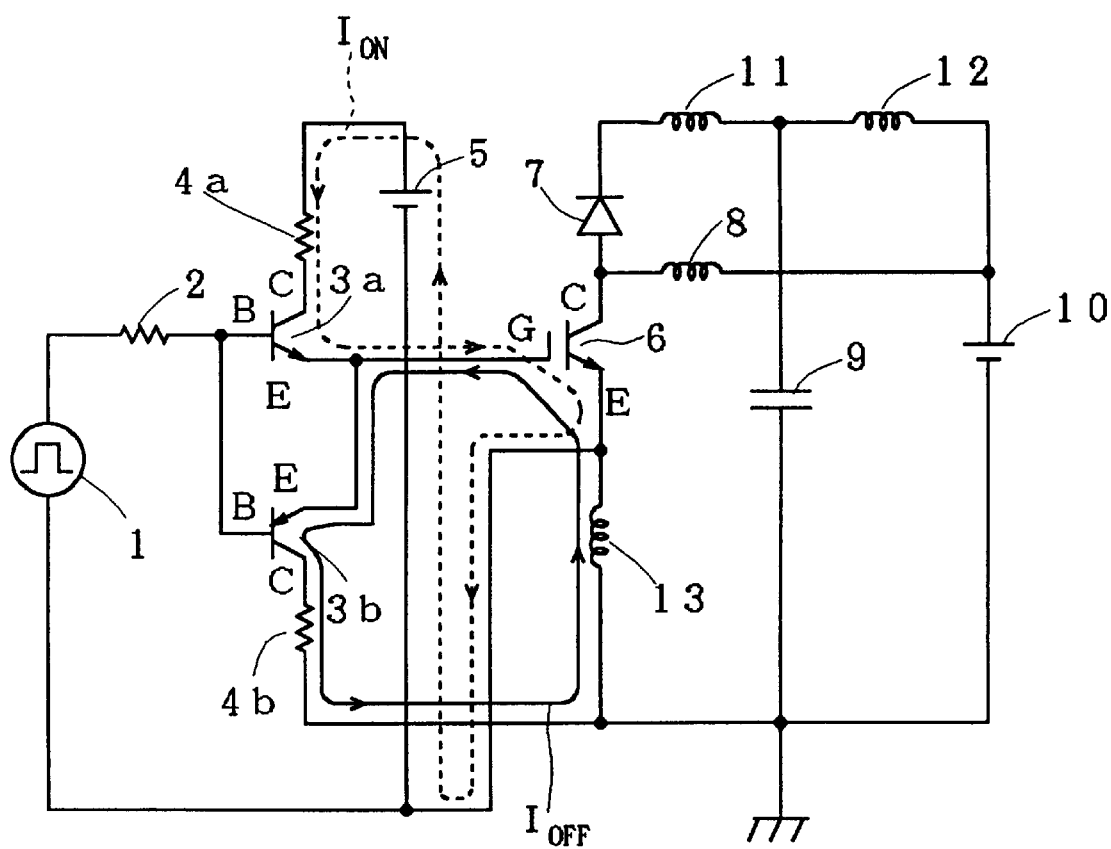
FIG. 1 is a circuit diagram of a power switching device and peripheral devices thereof in the preferred embodiment of the present invention.
Figure 6:
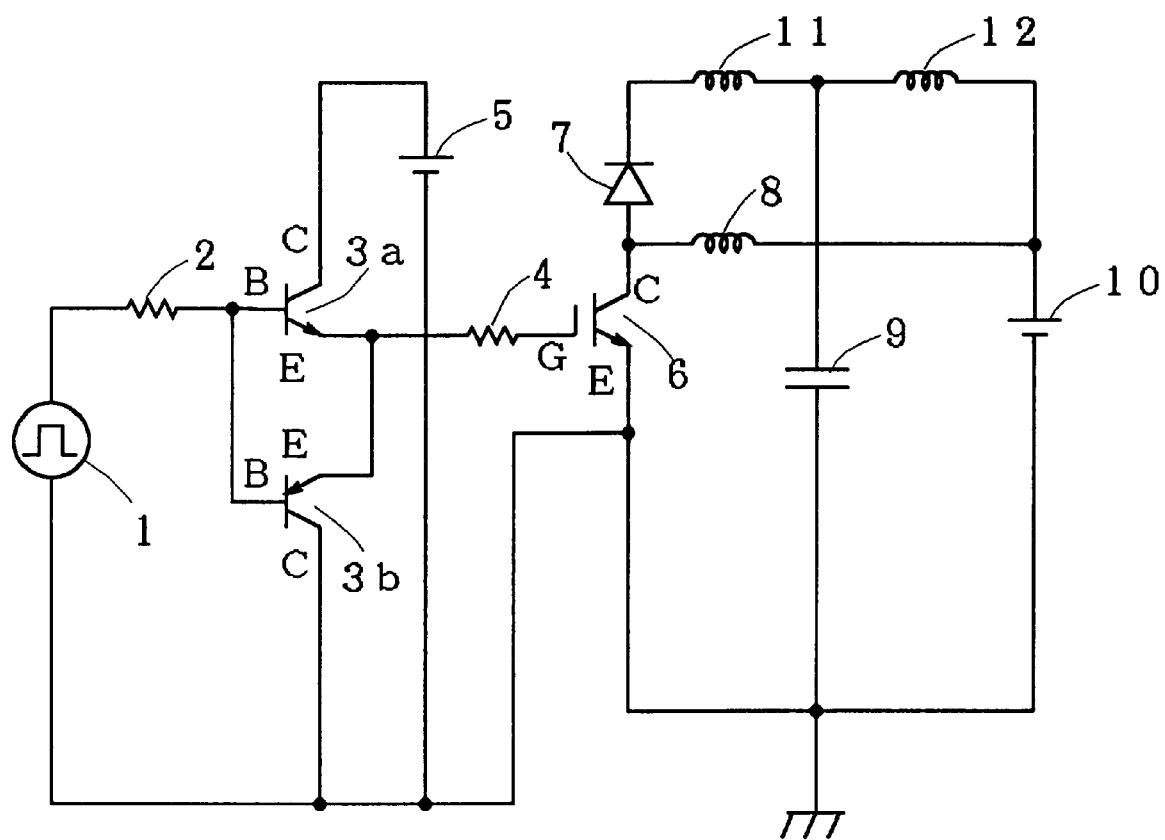
FIG. 6 is a circuit diagram of a conventional power switching device and peripheral devices thereof.

FIG. 1 is a circuit diagram showing the structure of a power switching device and the structure of peripheral devices thereof in the preferred embodiment of the present invention. In FIG. 1, the same reference characters are allotted to the same parts as those in the conventional device shown in FIG. 6.

The power switching device includes an IGBT element 6 as a power switching element, where the IGBT element 6 makes ON operation and OFF operation to turn on and off a load circuit connected to two main electrodes, i.e., a collector electrode C and an emitter electrode E. An inductive load 8 and a DC power source 10 are connected to the load circuit. The inductive load 8 and the DC power source 10 are provided outside the power switching device. An inductor 13 is further interposed in the load circuit. The inductor 13 is connected to the emitter electrode E of the IGBT element 6 and forms part of the power switching device.

A freewheeling diode 7 is connected in parallel to the inductive load 8 and a snubber capacitor 9 is connected in parallel to the DC power source 10. The freewheeling diode 7 and the snubber capacitor 9 forms a surge absorption circuit for absorbing the voltage surge due to the inductive load 8. Inductances 11 and 12 parasitically occur in the wiring connecting the DC power source 10, the freewheeling diode 7 and the snubber capacitor 9.

Emitter electrodes E of two transistors, that is, a transistor (ON driving transistor; transistor for ON driving) 3a and a transistor (off driving transistor; transistor for OFF driving) 3b are connected to the gate electrode G of the IGBT element 6. The collector electrode C of the ON driving transistor 3a is connected to the high potential side output of a DC power source 5 through a driving resistance 4a. The collector electrode C of the OFF driving transistor 3b is connected to one end of the inductor 13 on the opposite side to the end connected to the emitter electrode E of the IGBT element 6 through a driving resistance 4b. The low potential side output of the DC power source 5 is directly connected to the emitter electrode E of the IGBT element 6 without passing through the inductor 13.

Note that one end of the inductor 13 is connected to the emitter electrode E of the IGBT element 6, the low potential side output of the DC current source 5 for supplying the ON driving current is directly connected to the emitter electrode E of the IGBT element 6, and the OFF driving transistor 3b interposed in the path of the OFF current is coupled to the emitter electrode E of the IGBT element 6 through the inductor 13. As will be described later, this is the most important characteristic in the structure in producing the effect of decreasing both the switching loss and the surge voltage.

One end of the base resistance 2 is connected to the base electrodes B of both transistors 3a and 3b. A pulse generator 1 is connected between the other end of the base resistance 2 and the emitter electrode E of the IGBT element 6. The pulse generator 1 is provided outside the power switching device. The transistors 3a, 3b, the base resistance 2, the driving resistances 4a, 4b and the DC power source 5 form a control circuit for turning on and off the IGBT element 6 in response to a pulse signal inputted to the base electrodes B through the base resistance 2.

<2. Basic Operation of Device>

The device according to the preferred embodiment is so structured that it operates as described below. When the pulse generator 1 inputs a high voltage signal (15 V, for example) to the base resistance 2, the ON driving transistor 3a turns on and the OFF driving transistor 3b turns off. The current (ON driving current $I_{ON}$) supplied from the DC power source 5 is then provided to the gate electrode G through the ON driving transistor 3a, the voltage between the gate electrode G and the emitter electrode E, i.e., the gate voltage exceeds a gate threshold voltage peculiar to the IGBT element 6, and thus the IGBT element 6 turns on. The IGBT element 6 turns on to turn on the load circuit, and then the load current is supplied from the DC power source 10 to the inductive load 8.

When the pulse generator 1 inputs a low voltage signal (0 V, for example) to the base resistance 2, the OFF driving transistor 3b turns on and the ON driving transistor 3a turns off. Then the current (OFF driving current $I_{OFF}$) in the direction opposite to the ON driving current is supplied to the gate electrode G, the voltage between the gate electrode G and the emitter electrode E, i.e., the gate voltage becomes lower than the gate threshold voltage, and thus the IGBT element 6 turns off. The IGBT element 6 turns off to turn off the load circuit, and then the supply of the load current from the DC power source 10 to the inductive load 8 stops.

As the inductive load 8 has a function of holding the current constant corresponding to the magnitude of the inductance as described above, the load current flowing in the inductive load 8 takes a certain time to increase in magnitude if the IGBT element 6 turns on from off. On the other hand, when the IGBT element 6 turns off from on, the load current takes some time to attenuate. Accordingly, in the normal case in which the IGBT element 6 repeats ON and OFF with a sufficiently short period, the load current does not flow intermittently but it flows continually with pulsation more or less. The pulse generator 1 controls the proportion of the ON period and the OFF period of the IGBT element 6, which controls the effective value of the load current to a desired value. The above-described surge absorption circuit works to maintain the load current flowing in the inductive load 8 in the period when the IGBT element 6 turns off. That is to say, the surge absorption circuit provides a path in which the load current flows back to the inductive load 8 to serve to soften the attenuation of the load current. Also, it serves to decrease the surge voltage occurring in the inductive load 8 when the IGBT element 6 turns off and applied to the IGBT element 6.

<3. Characteristic Operation of Device>

As has been described above on the conventional device, the existence of the parasitic inductances 11 and 12 can be a cause of occurrence of high surge voltage especially when the IGBT element 6 turns off from on. The device according to this preferred embodiment, however, operates as described below to compatibly realize the decrease in the surge voltage together with the decrease in the switching loss.

As described above, when the pulse generator 1 outputs the low voltage signal, the OFF driving transistor 3b turns on and the ON driving transistor 3a turns off, and then the OFF driving current $I_{OFF}$ is supplied to the gate electrode G, with the result that the IGBT element 6 makes transition from the ON state to the OFF state. However, the transition is not made instantly but it proceeds slowly with the action of the inductor 13 and the control circuit. That is to say, as the IGBT element 6 moves to the OFF state, the main current flowing to the emitter electrode E from the collector electrode C of the IGBT element 6 attenuates. The attenuation of the main current causes the inductive voltage in the inductor 13 and thus the potential of the emitter electrode E of the IGBT element 6 is pulled down. This works in the direction in which the voltage between the gate electrode G and the emitter electrode E in the IGBT element 6, that is; the gate voltage, increases, therefore the speed of the transition from ON to OFF in the IGBT element 6, that is, the switching speed is slowed down.

Further, the closed circuit of the OFF driving current (indicated by the solid arrow in FIG. 1) formed when the OFF driving transistor 3b turns on includes the inductor 13. Furthermore, the OFF driving current $I_{OFF}$ and the main current flow in the opposite direction from each other in the inductor 13. Accordingly, the OFF driving current $I_{OFF}$ once raises, and then decreases due to a voltage which is induced to the inductor 13 when the main current decreases. This soften the transition of the IGBT element 6 from ON to OFF more effectively. As a result, the main current flowing in the IGBT element 6 attenuates calmly, and the increase in the current flowing in the surge absorption circuit becomes calm, too. Accordingly, the surge voltage occurring due to the parasitic inductances 11 and 12 is suppressed low.

On the other hand, when the pulse generator 1 outputs the high voltage signal, the ON driving transistor 3a turns on and the OFF driving transistor 3b turns off and then the ON driving current $I_{ON}$ is supplied to the gate electrode G, with the result that the IGBT element 6 makes transition from the OFF state to the ON state. At this time, as compared with the transition from the ON state to the OFF state, the transition proceeds more rapidly. The reason is that the closed circuit of the ON driving current $I_{ON}$ (designated by the dotted arrow in FIG. 1) formed when the ON driving transistor 3a turns on does not include the inductor 13. The fact that one of the two paths includes the inductor 13 and the other does not includes the inductor 13 is derived from the characteristic in the structure that the low potential side output of the DC power source 5 is directly connected to the emitter electrode E while the OFF driving transistor 3b is coupled to the emitter electrode E of the IGBT element 6 through the inductor 13.

As the transition proceeds quickly when the IGBT element 6 transfers from OFF to ON, the switching loss occurring in the IGBT element 6 with the transition is controlled low. That is to say, this device preferentially suppresses the surge voltage when the IGBT element 6 makes transition from ON to OFF when the surge voltage due to the parasitic inductances 11 and 12 occurs, and preferentially realizes the decrease in the switching loss in the transition from OFF to ON where the surge voltage does not occur. This simultaneously realizes both the subjects of effectively decreasing the switching loss and suppressing the occurrence of the surge voltage.

<4. Positive Data and Optimization of Circuit Constant>

Figure 2:
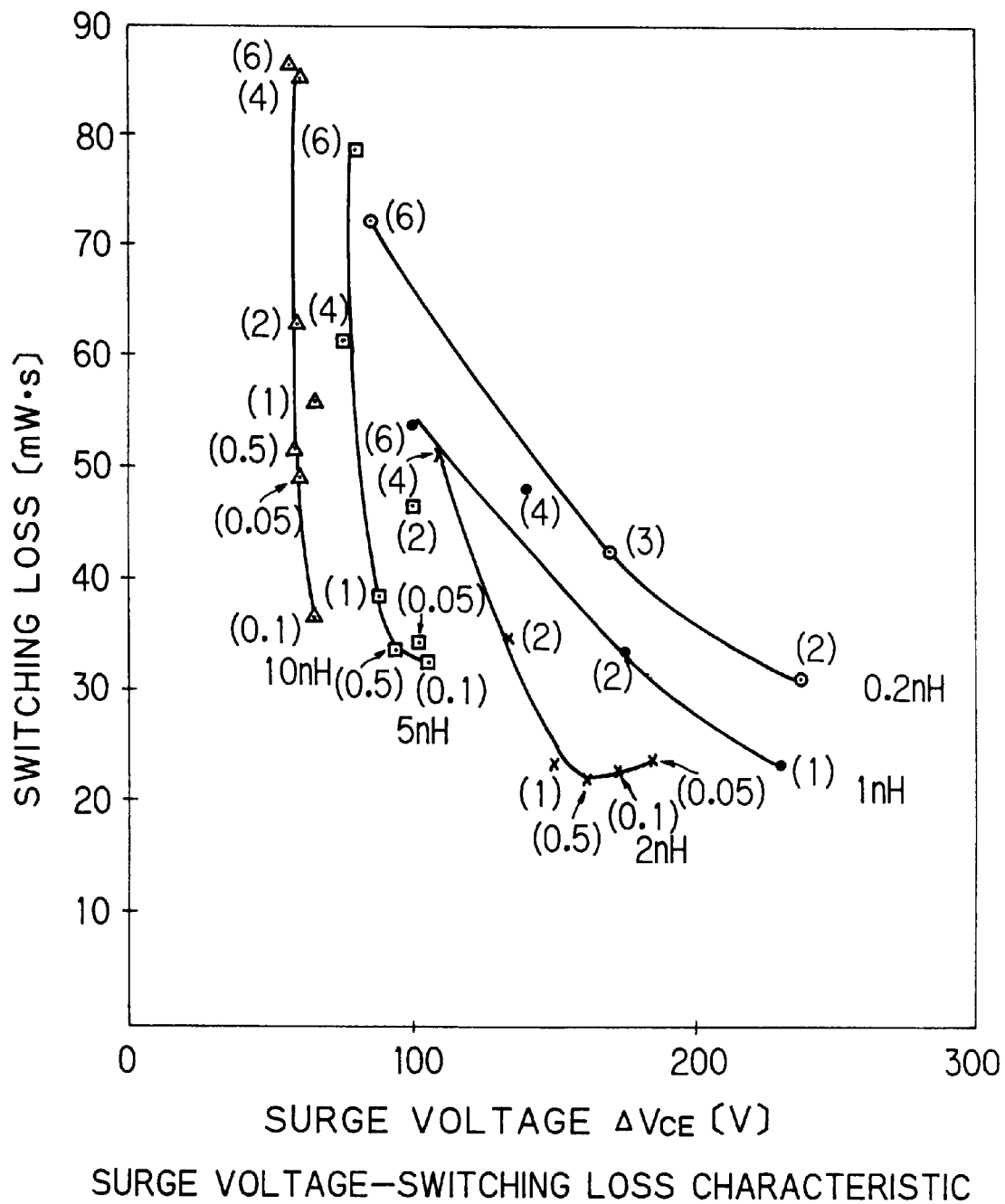
FIG. 2 is a graph showing the result of the simulation about the device of the preferred embodiment.

Next, a description will be made on the results of proving the operation and optimizing the circuit constants using the circuit simulator about the device of this preferred embodiment shown in FIG. 1. FIGS. 2 though 5 are graphs showing the results obtained by performing simulation about a power switching device with the circuit structure shown in FIG. 1 and having the voltage rating of 600 V and the current rating of 400 A. In this simulation, the magnitudes of the switching loss and the surge voltage $\Delta V_{CE}$ were obtained with parameters of the inductance L of the inductor 13 and resistance values R of the driving resistances 4a and 4b. The resistance values of the driving resistances 4a and 4b are set to magnitudes common to each other.

FIG. 2 is a graph showing the surge voltage $\Delta V_{CE}$ vs. switching loss characteristics. The numerals in the parentheses ( ) indicate the resistance values R. From FIG. 2, it is seen that the surge voltage $\Delta V_{CE}$ becomes smaller as the inductance L becomes larger. That is to say, the data proves that the inductor 13 has the effect of reducing the surge voltage $\Delta V_{CE}$ and its effect is more considerable as the inductance is larger.

Figure 3:
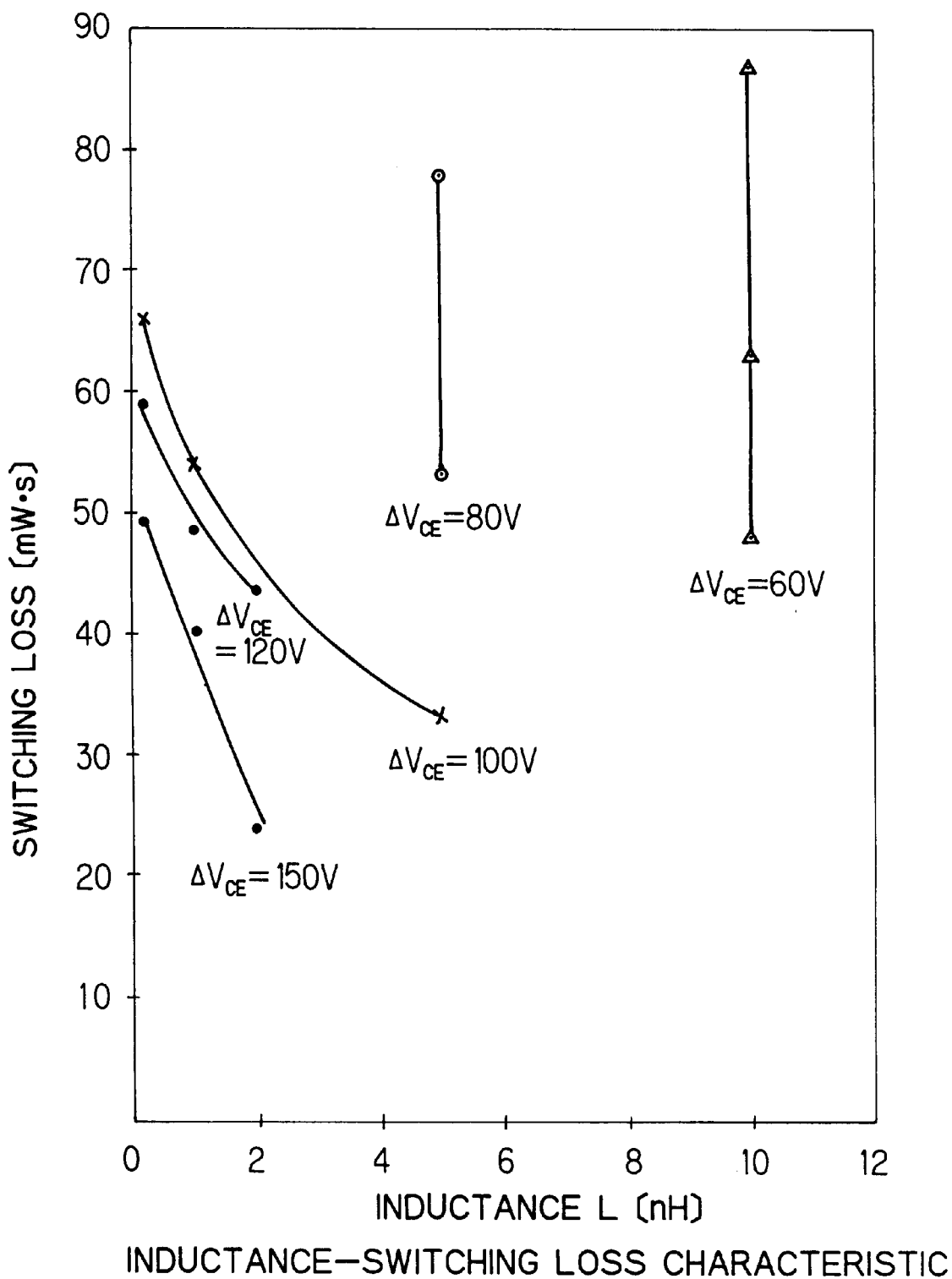
FIG. 3 is a graph showing the result of the simulation about the device of the preferred embodiment.

The relation between the inductance L and the switching loss may not be clearly concluded from the graph of FIG. 2. Accordingly, the graph of FIG. 2 was re-edited to clearly recognize the relation, and the graph showing the relation of the inductance L vs. the switching loss with the parameter of the surge voltage $\Delta V_{CE}$ was obtained. FIG. 3 shows the graph. From this graph, it is read that the switching loss becomes lower as the inductance L becomes larger under the condition where the surge voltage $\Delta V_{CE}$ is constant in the range in which the surge voltage $\Delta V_{CE}$ is not less than 100 V. That is to say, the graph of FIG. 3 substantiates that the provision of the inductor 13 can compatibly realize both the decrease of the surge voltage $\Delta V_{CE}$ and the decrease in the switching loss.

Figure 4:
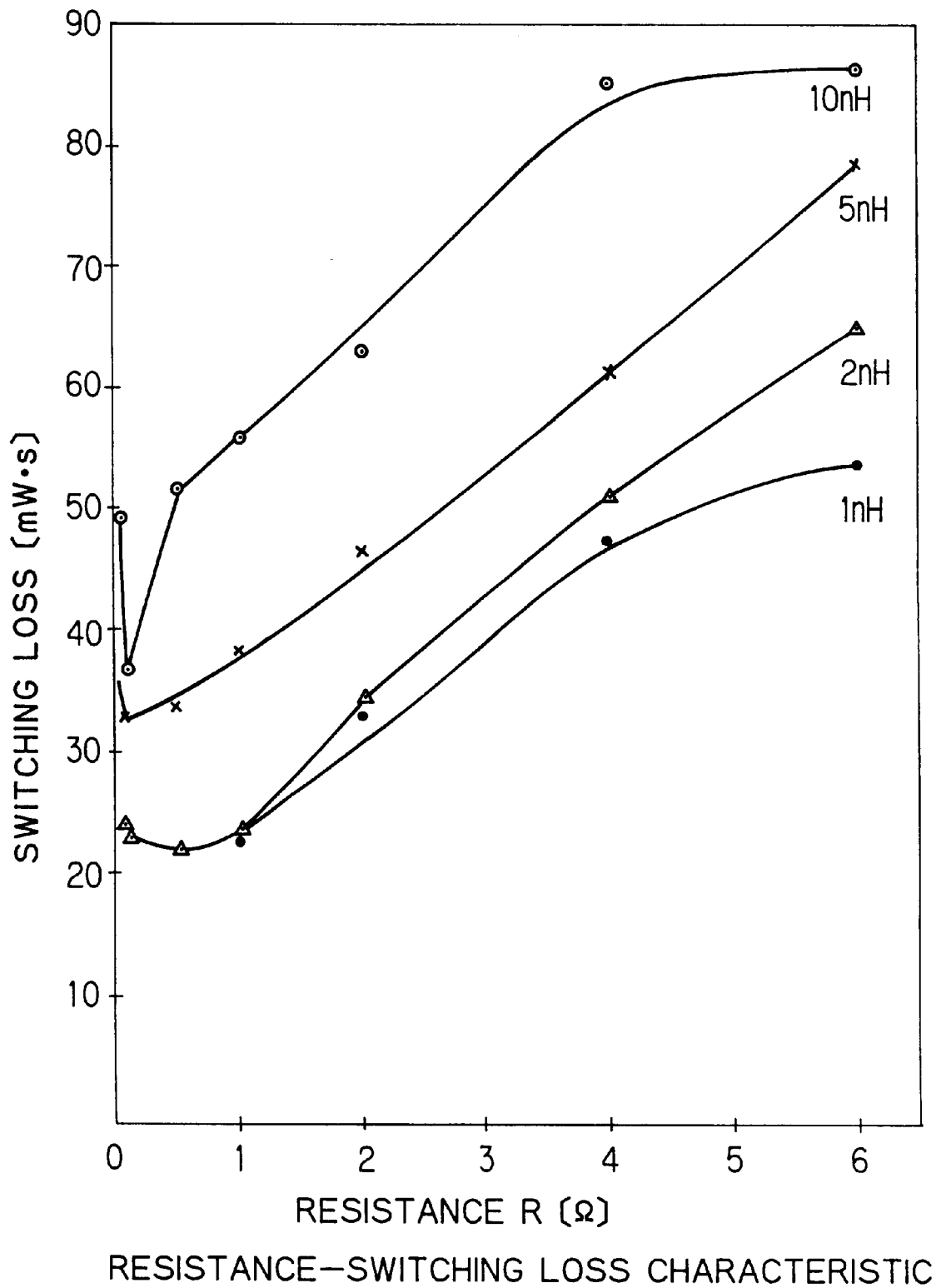
FIG. 4 is a graph showing the result of the simulation about the device of the preferred embodiment.

Next, the most suitable range of the magnitude of the inductance L and the magnitude of the resistance value R will be considered. FIG. 4 is a graph obtained by re-editing the graph of FIG. 2, which shows the dependance of the switching loss on the resistance value R with the parameter of the inductance L. It is understood from this graph that the switching loss is lower as the resistance value R is lower excepting some range where the resistance value R is sufficiently low under the condition where the inductance L is constant, and that the switching loss is lower as the inductance L is lower under the condition where the resistance value R is constant. Accordingly, upper limits must be set about the inductance L and the resistance value R to control the switching loss under a certain permitted value which is required in practice. It is desirable to set the upper limit of the switching loss approximately 40 mW.s for practical application. It can be said from the permitted upper limit of the switching loss that the inductance L is preferably not more than 5 nH. As for the resistance value R, if the inductance L is 2 nH, for example, the resistance value R is preferably not more than 2 Ω, and if the inductance L is 5 nH, the resistance value R is preferably not more than 1 Ω.

The permitted upper limit value of the switching loss depends on the rating of the IGBT element 6 to some extent, and the resistance value R vs. switching loss characteristic shown in FIG. 4 also somewhat varies according to the rating. Considering these facts, in the general cases with the rating of the IGBT element of 100 A or higher, it can be concluded that the inductance L is preferably 5 nH or lower and the resistance value R is preferably 3 Ω or lower.

Figure 5:
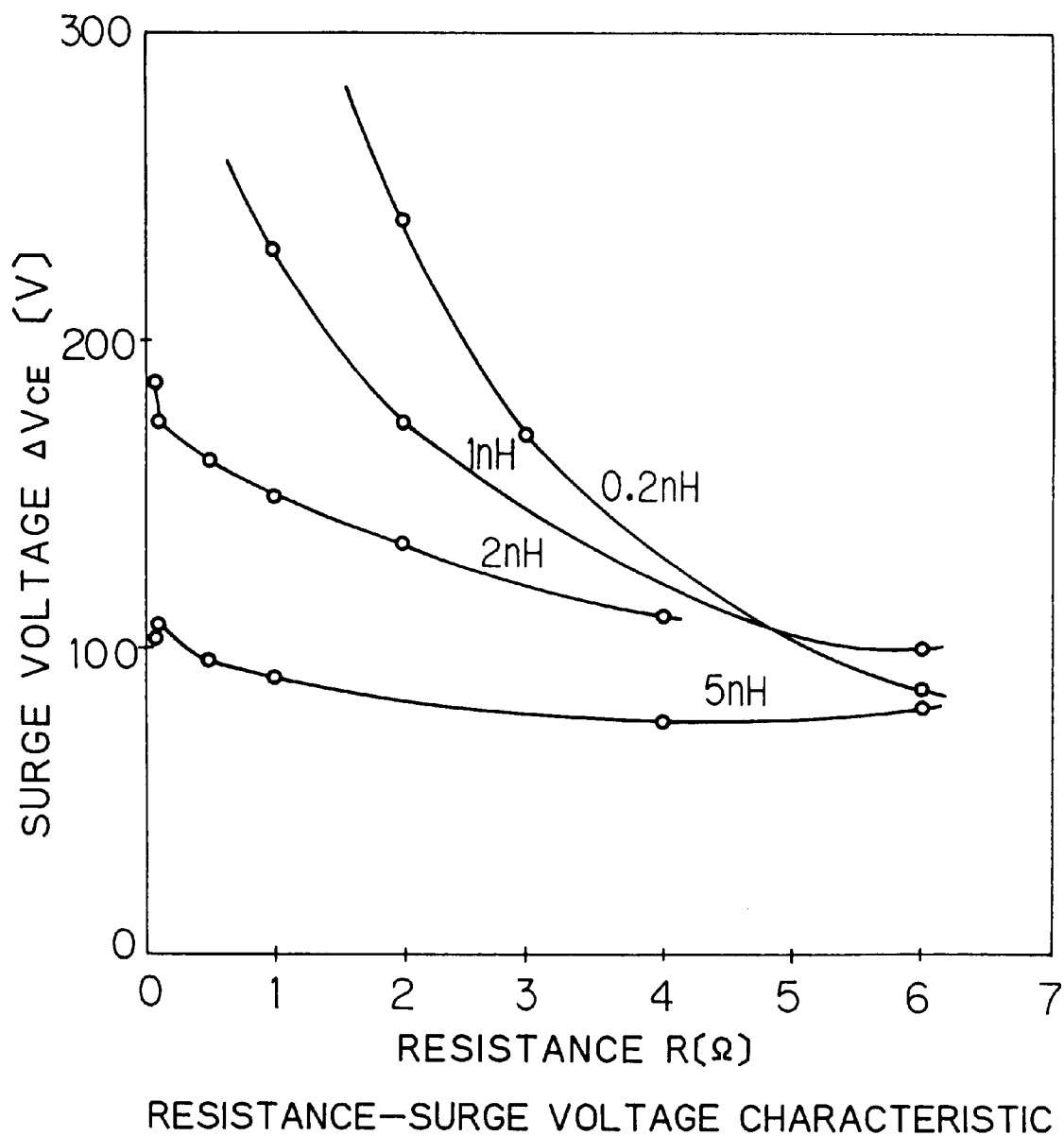
FIG. 5 is a graph showing the result of the simulation about the device of the preferred embodiment.

FIG. 5 is a graph obtained by re-editing the graph of FIG. 2 which shows the dependance of the surge voltage $\Delta V_{CE}$ on the resistance value R with a parameter of the inductance L. It is seen from this graph that the surge voltage $\Delta V_{CE}$ is lower as the inductance L is higher under the condition in which the resistance value R is constant excepting the range where the resistance value R is high enough and the surge voltage $\Delta V_{CE}$ is lower as the resistance value R is higher under the condition where the inductance L is constant excepting the range in which the inductance L is high enough. When the inductance L is 5 nH or higher, the surge voltage $\Delta V_{CE}$ hardly depends on the resistance value R but is almost constant.

To obtain the effect of decreasing the surge voltage $\Delta V_{CE}$ by the inductance L to a degree effective in practice, it is necessary to set the inductance L to a certain lower limit value or higher. When the rating in the IGBT element 6 is not lower than 100 A as described above, it is desirable to set the inductance L to 1 nH or higher.

While the invention has been shown and described in detail, the foregoing description is in all aspects illustrative and not restrictive. It is therefore understood that numerous modifications and variations can be devised without departing from the scope of the invention.

What is claimed is:

1. A power switching device comprising:
   a control circuit having an output;
   a power switching element having a control electrode connected to the output of said control circuit and having a pair of main electrodes; and
   an inductor connected to one of said pair of main electrodes of said power switching element;
   said power switching element performing an OFF operation and an ON operation in response to an output of said control circuit to turn off and on a main current flowing across said pair of main electrodes;
   wherein a path of an OFF driving current, which said control circuit supplies to said control electrode to bring said power switching element to said OFF operation, includes said inductor; said off driving current flowing in the opposite direction as said main current of said power switching element in said inductor; and
   wherein a path of an ON driving current, which said control circuit supplies to said control electrode to bring said power switching element to said ON operation, excludes said inductor.

2. The power switching device according to claim 1, wherein,
   said power switching element is an insulated gate bipolar transistor element,
   one end of said inductor is connected to an emitter electrode of said insulated gate bipolar transistor element, and
   said control circuit comprises a transistor for OFF driving for supplying the OFF driving current to said control electrode by turning on said path of said OFF driving current and a transistor for ON driving for supplying the ON driving current to said control electrode by turning on said path of said ON driving current.

3. The power switching device according to claim 2, wherein,
   said insulated gate bipolar transistor element has current capacity of 100 A or more, magnitude of inductance of said inductor is 1 nH–5 nH, a resistance value of an OFF driving resistance interposed in said path of said OFF driving current is 3 Ω or less, and a resistance value of an ON driving resistance interposed in said path of said ON driving current is 3 Ω or less.

4. The power switching device according to claim 2, wherein said transistor for OFF driving is interposed between a gate electrode of said insulated gate bipolar transistor element and the other end of said inductor, and said transistor for ON driving is interposed between a power source for supplying said ON driving current and said gate electrode.

5. The power switching device according to claim 4, wherein an OFF driving resistance is interposed between said transistor for OFF driving and said other end of said inductor, and an ON driving resistance is interposed between said transistor for ON driving and said power source.

6. The power switching device according to claim 5, wherein a control electrode of said transistor for OFF driving and a control electrode of said transistor for ON driving are connected to each other and a connection portion with an external pulse generator is provided at a connection point of these control electrodes.

7. The power switching device according to claim 6, wherein an input resistance is interposed between said connection point and said connection portion.

8. A power switching device comprising:

a control circuit having an output;

a power switching element having a control electrode connected to the output of said control circuit and having first and second main electrodes; and an inductor connected to said second main electrode of said power switching element;

said power switching element performing an OFF operation and an ON operation in response to an output of said control circuit to turn off and on a main current flowing across said first and second main electrodes;

said control circuit including a first transistor and a second transistor, each of said first and second transistors having a base, emitter, and collector, the bases of said first and second transistors being connected together and connected to an input terminal, the emitters of said first and second transistors being connected together and connected to the control electrode of said power switching element, and the collector of said second transistor being connected to said inductor at the end opposite the end connected to said second main electrode;

a power supply having one end connected to the collector of said first transistor and a second end connected to the second main electrode of said power switching element;

wherein a path of an ON driving current, which brings said power switching element to said ON operation, includes the power supply, first transistor and power switching element, while a path of an OFF driving current, which brings said power switching element to said OFF operation, includes the second transistor, inductor, and power switching element; and wherein the OFF driving current flow in opposite directions as said main current of the power switching element in said inductor.

* * * * *